United States Patent
Glovatsky et al.

(10) Patent No.: US 6,778,389 B1
(45) Date of Patent: Aug. 17, 2004

(54) MICROELECTRONIC PACKAGE WITH TUBULAR HOUSING

(75) Inventors: Andrew Z. Glovatsky, Plymouth, MI (US); Vladimir Stoica, Farmington Hills, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 10/613,447

(22) Filed: Jul. 3, 2003

(51) Int. Cl.[7] .................................................. H05K 7/20
(52) U.S. Cl. ........................ 361/690; 361/704; 361/719; 361/720; 361/721; 165/80.1; 174/16.1
(58) Field of Search .................................. 360/676–679, 360/690, 704, 707, 719, 721; 165/80.1, 185; 174/16.1, 16.3

(56) References Cited

U.S. PATENT DOCUMENTS

| | | | |
|---|---|---|---|
| 3,434,014 A | | 3/1969 | Taynton |
| 3,755,891 A | | 9/1973 | Muckelroy et al. |
| 4,051,414 A | | 9/1977 | Will et al. |
| 4,399,488 A | | 8/1983 | Ruwe et al. |
| 4,400,858 A | * | 8/1983 | Goiffon et al. ............... 24/546 |
| 4,513,064 A | | 4/1985 | Marcus |
| 4,810,917 A | | 3/1989 | Kumar et al. |
| 4,833,568 A | | 5/1989 | Berhold |
| 4,858,068 A | * | 8/1989 | Bitller et al. ............... 361/679 |
| 5,105,337 A | * | 4/1992 | Bitller et al. ............... 361/722 |
| 5,204,806 A | | 4/1993 | Sasaki et al. |
| 5,251,099 A | * | 10/1993 | Goss et al. ................. 361/721 |
| 5,586,004 A | * | 12/1996 | Green et al. ................ 361/699 |
| 5,621,617 A | * | 4/1997 | Goss et al. ................. 361/721 |
| 6,351,383 B1 | * | 2/2002 | Payton ....................... 361/704 |
| 6,404,637 B2 | * | 6/2002 | Hutchison et al. .......... 361/704 |
| 6,501,653 B1 | * | 12/2002 | Landsgestell et al. ....... 361/699 |
| 6,707,670 B2 | * | 3/2004 | Seal .......................... 361/704 |
| 2003/0048611 A1 | * | 3/2003 | Skofjanec ................... 361/704 |

FOREIGN PATENT DOCUMENTS

JP         03250793 A   *  11/1991   ............ H05K/7/20

* cited by examiner

*Primary Examiner*—Boris Chervinsky
(74) *Attorney, Agent, or Firm*—Brinks Hofer Gilson & Lione

(57) ABSTRACT

A microelectronic package comprises a tubular housing and a microelectronic assembly affixed to a support that is received in the housing. The support may be a cage-like structure that comprises axial ribs to which the microelectronic assembly is attached. Alternately, the support may comprise a solid surface for affixing a flexible substrate. The microelectronic assembly is arranged with a major surface facing and spaced apart from the inner wall of the housing. Thus, the microelectronic assembly is proximate to the wall to provide an optimum volume for packaging other components. Movement, the spacing between the microelectronic assembly and the tubular housing facilitates coolant gas flow during use to enhance thermal dissipation.

15 Claims, 4 Drawing Sheets

MICROELECTRONIC PACKAGE WITH TUBULAR HOUSING

TECHNICAL FIELD OF THE INVENTION

This invention relates to a microelectronic package contained in a tubular housing. More particularly, this invention relates to such microelectronic package wherein a microelectronic assembly, which includes electronic components mounted on the substrate that is affixed to a support and disposed within the tubular housing spaced apart therefrom.

BACKGROUND OF THE INVENTION

A microelectronic assembly comprises electronic components mounted on a printed circuit board which may be a rigid board or a flexible membrane. The assembly is typically protected by a housing, the size and shape of which is determined by the nature of the product. In some instances, it is desired to locate the microelectronic assembly within a tubular housing. For example, in military missiles, the housing may have a cylindrical shape. The microelectronic assembly may be arranged so that the printed circuit board is perpendicular to the central axis of the housing. Additional components, which may include batteries, gyroscopic components, motors or ordinance, may be disposed within the remaining volume of the housing. However, this perpendicular arrangement blocks coolant gas flow through the housing and thus does not provide adequate thermal dissipation for heat generated by microelectronic components during use. Alternately, the printed circuit boards may be disposed parallel to the axis to facilitate coolant gas flow through the housing. However, the printed circuit boards then divide the housing in a manner that does not provide a suitable volume for conveniently receiving other components.

Therefore, a need exists for an improved arrangement of a microelectronic assembly within a tubular housing that provides for efficient use of packaging volume by maximizing the space available for other components, and also provides for enhanced thermal dissipation by facilitating coolant gas flow about the microelectronic components.

SUMMARY OF THE INVENTION

In accordance with this invention, a microelectronic package is provided that comprises a tubular housing having a circumferential wall that defines a compartment. A microelectronic assembly is affixed to a support that is received in the compartment. The microelectronic assembly includes a substrate having a major surface and is carried on the support such that the major surface faces the circumferential wall and is spaced apart therefrom. By arranging the microelectronic assembly proximate to the walls, the package permits other components to be located within the interior volume of the support. Moreover, the microelectronic package provides spacing between the microelectronic assembly and the tubular housing to facilitate coolant gas flow. Therefore, the microelectronic package of this invention provides both an efficient use of packaging volume and enhanced thermal dissipation.

SUMMARY OF THE FIGURES

This invention will be further illustrated with reference to the accompanying drawings wherein.

DETAILED DESCRIPTION OF INVENTION

Figure 1:
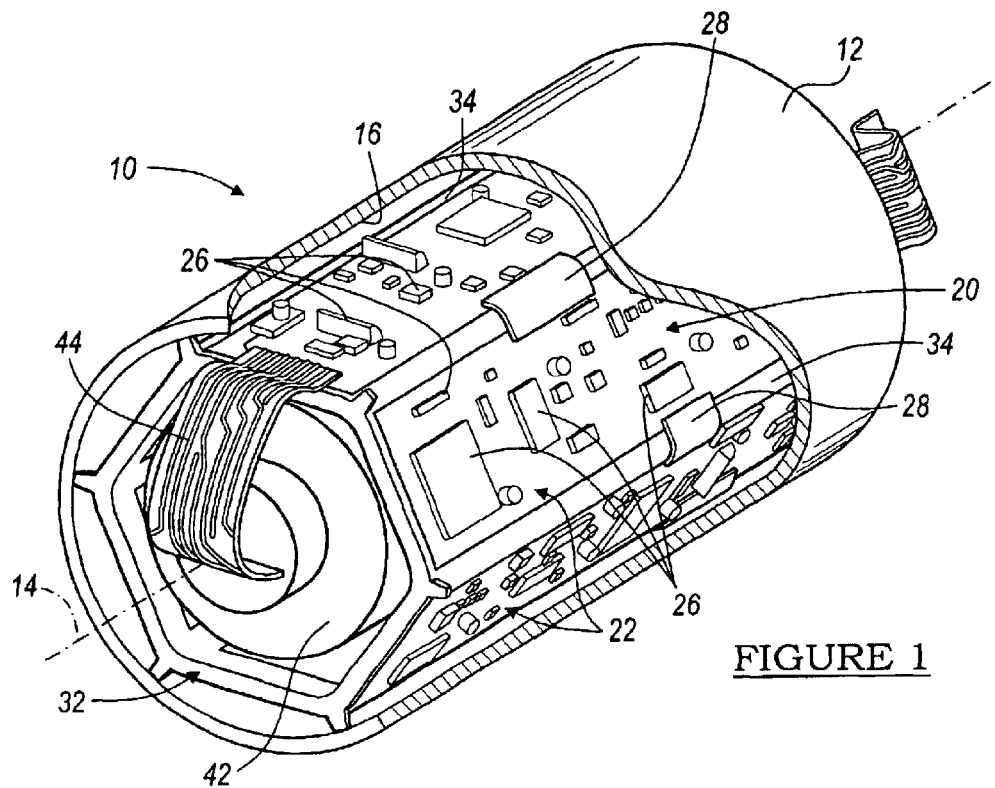
FIG. 1 is a perspective view of a microelectronic package in accordance with a first preferred embodiment of this invention.

In accordance with a preferred embodiment of this invention, referring to FIGS. 1 through 4, a microelectronic package 10 comprises a tubular housing 12 that is cylindrical about an axis 14. By way of a preferred example, housing 12 may be a segment of a casing of a missile. Housing 12 includes an inner wall 16 that defines a compartment 18 for containing microelectronic circuit elements.

Figure 2:
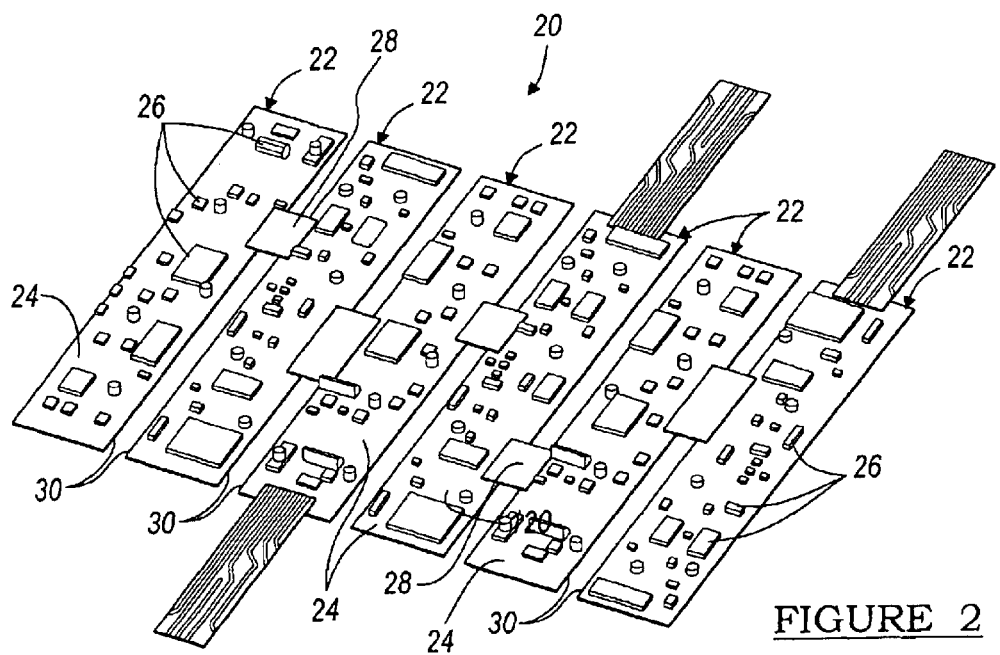
FIG. 2 is a perspective view of a microelectronic assembly that is a component of the microelectronic package in FIG. 1.
Figure 3:
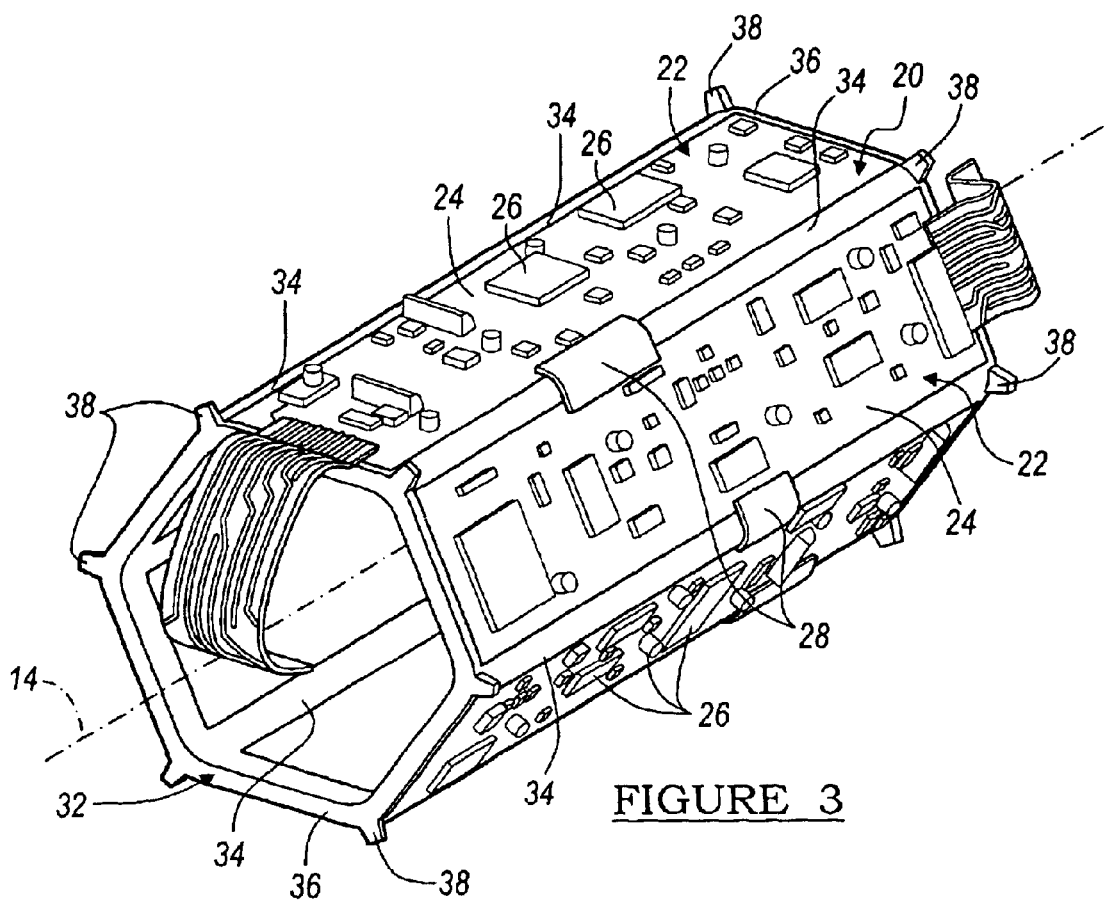
FIG. 3 is a perspective view showing a microelectronic assembly and a support for the microelectronic package in FIG. 1.
Figure 4:
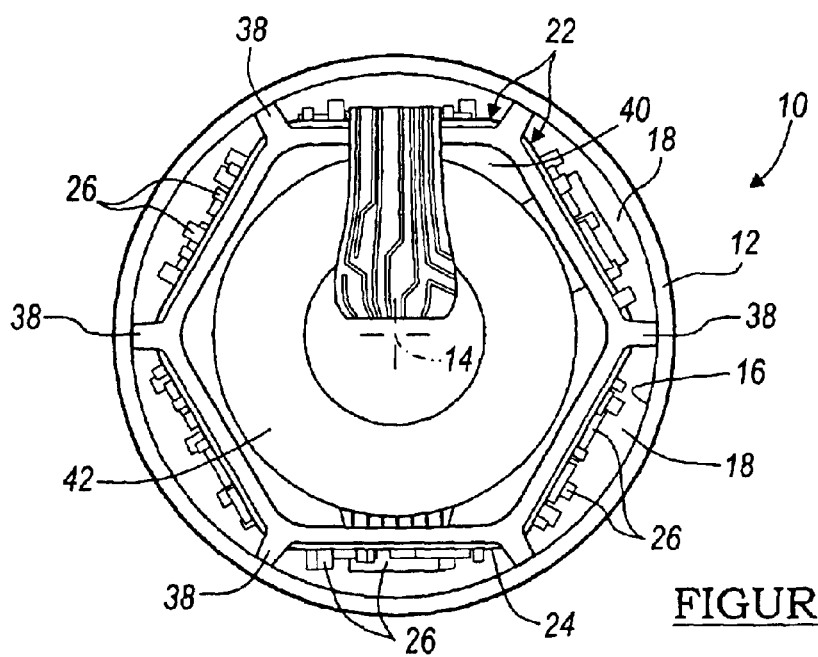
FIG. 4 is an end view of the microelectronic package in FIG. 1.

Package 10 further comprises a microelectronic assembly 20, which is depicted in FIG. 2 in a planar configuration adapted for manufacture and prior to assembly in package 10. In this embodiment, assembly 20 comprises a plurality of substrates 22 which are preferably rigid FR4 boards. Substrates 12 comprise first major faces 24 onto which electronic components 26 are mounted and connected by metallic traces (not shown). Substrates 22 also include a second major face opposite face 24, to which electronic components and circuit traces may also be attached. It is pointed out that edges 30 of substrates 22 are spaced apart, with circuit traces on adjacent boards being interconnected by flexible interconnects 28.

Assembly 20 is mounted on a support 32 that is sized and shaped to be axially received in housing 12. Support 32 is preferably an integral, self-sustaining cage formed of metal or plastic and comprising axial ribs 34 connected by end frames 36 to form a polygonal prismatic structure. Adjacent ribs 34 are spaced apart by segments of end frames 36 to define a cell sized and shaped to receive a substrate 22 of assembly 20. Assembly 20 is mounted onto support 12 with edges 30 of each substrate 22 attached to the adjacent ribs, and with flexible interconnects 28 bridging ribs 34 between adjacent substrates to interconnect the electrical circuits thereon.

Support 32 further includes spacers 38 that extend radially outward and engage inner wall 16 of housing 12. In the depicted embodiment, spacers 38 protrude from end frames 36. Alternately, spacers may extend from ribs 34. Spacers 38 space apart substrates 22 from housing 12 to provide clearance for electronic components 26. In addition, the spacing between the housing and the microelectronic assembly 20 forms a peripheral passage through which air or other coolant gas may be conveyed. During use, heat is generated by electronic components 26 and is extracted by cooling gas flowing through the peripheral space about microelectronic assembly 20.

It is an advantage of this invention that support 32 arranges microelectronic subassembly proximate to housing 12. As a result, the subassembly of support 32 and microelectronic assembly 20 defines an interior chamber 40 for receiving other components. In the depicted embodiment, a battery 42 is inserted into chamber 40 and connected by flexible interconnects 44 to microelectronic assembly 20 for purposes of powering the electrical circuits thereon. Alternately, chamber 40 may suitably contain a gyroscopic component, a global positioning system, ordinance, or other components of the product.

Therefore, this invention provides a package 10 that includes a microelectronic assembly 20 mounted on a support 32 and received in a housing 12. Assembly 20 is arranged proximate to housing 12 to provide an inner chamber 40 for receiving other components. The major faces 24 of microelectronic assembly 20 that include electronic components 26 face housing 12 and are spaced apart to accommodate coolant gas flow. Therefore, package 10 provides both an efficient use of packaging space and also enhances thermal dissipation by coolant gas flow during use.

In the embodiment depicted in FIGS. 1 through 4, microelectronic assembly 20 is formed a multiple rigid printed circuit boards. Alternately, microelectronic assembly 20 may be formed of flexible substrates that are held in a planar configuration by the support to minimize flexure that might otherwise damage the electrical circuits during use. In yet another alternative, assembly 20 may be formed of a single flexible substrate that is wrapped about support 32, including overlying ribs 34. Also, in the embodiments depicted in FIGS. 1–4, support 32 includes spacers 38 for spacing assembly 20 apart from inner wall 16 of housing 12. Alternately, spacers may be provided on inner wall 16, or may be provided by separate elements.

Figure 5:
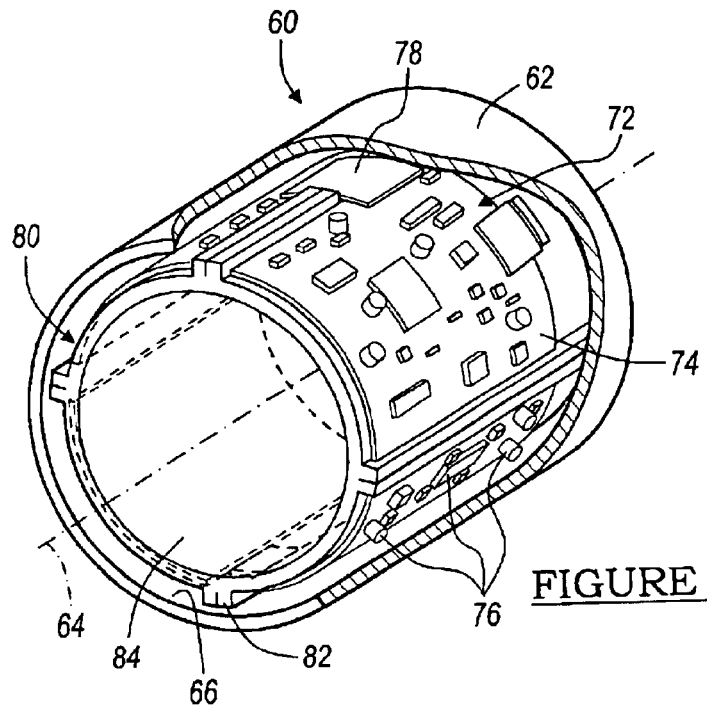
FIG. 5 is a microelectronic package in accordance with a second embodiment of this invention.
Figure 6:
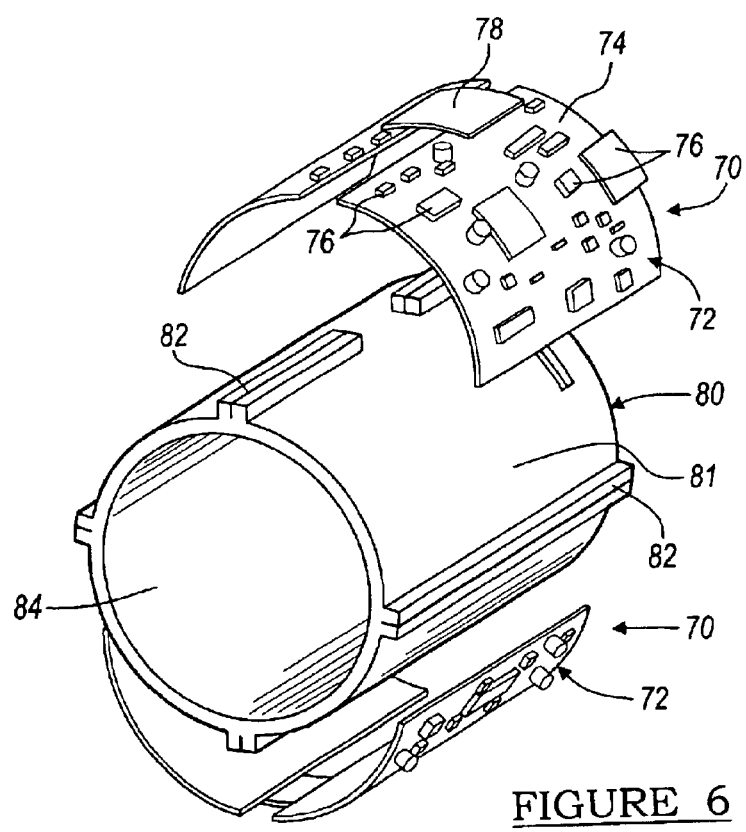
FIG. 6 is an exploded perspective view showing the microelectronic assembly and support for the microelectronic package in FIG. 5.

Referring now to FIGS. 5 and 6, there is depicted an alternative embodiment of a microelectronic package 60 in accordance with this invention. Package 60 includes a housing 62 that is cylindrical about an axis 64 and comprises an inner wall 66 that defines a compartment. In this embodiment, package 60 includes a microelectronic assembly 70 formed of flexible substrates 72 having a major face 74 onto which electronic component 76 and circuit traces (not shown) are attached. Circuits on adjacent substrates 72 are interconnected by flexible interconnects 78. Also in this embodiment, microelectronic assembly 70 is affixed to a support 80 that is a hollow cylinder formed of metal or plastic and coaxially arranged within housing 62. Support 80 comprises an assembly support surface 81 and axial spacers 82 that protrude from surface 81 and engage inner wall 66 of housing 62 to space apart microelectronic assembly 70 from the housing to provide clearance for electronic component 76 and to form peripheral passages for conveying coolant gas during use. It is a feature of this embodiment that support 80 defines an inner chamber 84 for receiving other components, and also provides a solid, protective wall dividing the microelectronic assembly from the components within the inner chamber. Thus, package 60 provides both an efficient use of packaging volume and thermal dissipation by cooling gas flow through the peripheral passages about microelectronic assembly 70.

Figure 7:
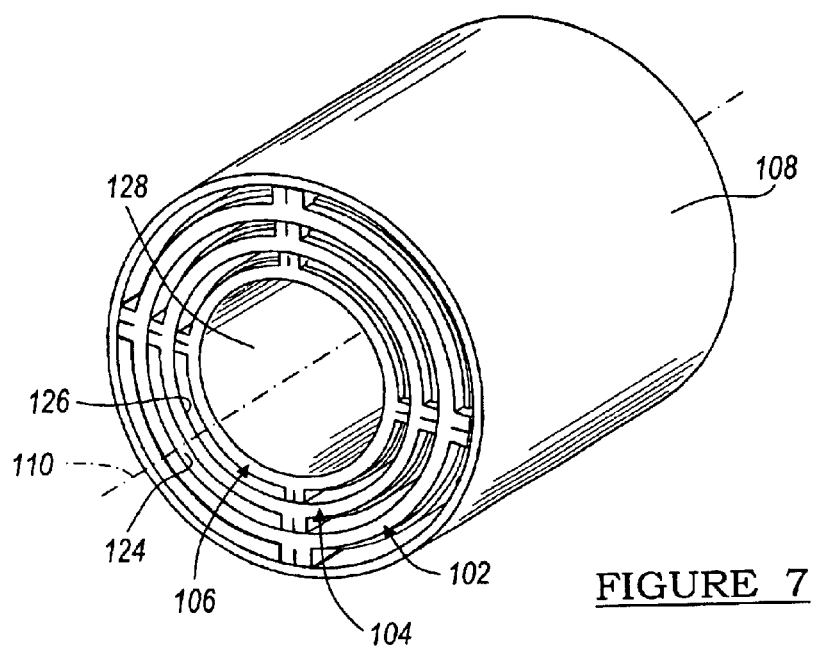
FIG. 7 is a perspective view showing a microelectronic package in accordance with a third embodiment of this invention.
Figure 8:
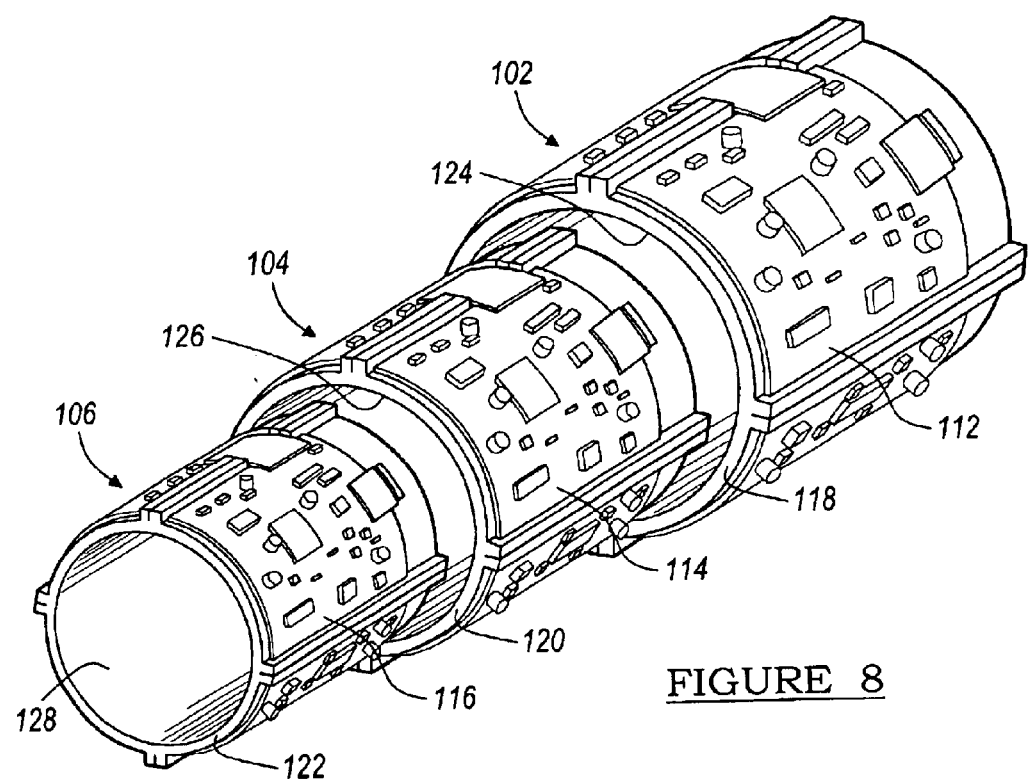
FIG. 8 is an exploded perspective view showing microelectronic assemblies and supports for the microelectronic package in FIG. 7.

Referring to FIGS. 7 and 8 that includes multiple subpackages 102, 104 and 106 that are concentrically received in a housing 108 that is cylindrical about an axis 110. Each subpackage 102, 104 and 106 comprises a microelectronic assembly 112, 114 and 116, respectively, that is mounted on a support 118, 120 and 122, respectively, which are substantially similar to the arrangement of microelectronic assembly and support of package 60 in FIGS. 4–6, but are progressively sized. Subpackage 102 is received in housing 108 so that spacers of support 118 engage the housing to position the structure therein. Subpackage 102 defines an inner chamber 124 into which is received subpackage 104, with the spacers of support 120 engaging inner chamber 124. Similarly, subpackage 104 defines an inner chamber 126 into which is received subpackage 106, with the spacers of support 122 engaging structure 104. Subpackage 106 includes an inner chamber 128 into which other components may be suitably packaged. Thus, in this example, subpackage 102 forms a housing for receiving subpackage 104, and subpackage 104 forms a housing for receiving subpackage 106. In each instance, the subpackage includes a microelectronic assembly mounted on a support that is spaced apart from its housing to define passages for conveying coolant gas during use. Moreover, the subpackage defines chambers for receiving additional components, which, for subpackage 102, includes the additional subpackages 104 and 106.

Therefore, this invention provides a microelectronic package wherein microelectronic assemblies are mounted on a support, which may be a cage or solid structure, and are inserted within a tubular housing. The microelectronic assemblies comprises substrates having major faces that face the housing and are spaced apart to define passages about the microelectronic package for coolant gas flow during use. Nevertheless, the assemblies are disposed proximate to the housing to provide an optimum volume for containing additional components.

While this invention has been described in terms of certain embodiments thereof, it is not intended to be so limited, but rather only to the extent set forth in the claims that follow.

What is claimed is:

1. A microelectronic package comprising
   a tubular housing comprising an inner wall defining a compartment;
   a support received in the compartment;
      a microelectronic assembly affixed to the support and including a substrate comprising a major surface, said microelectronic assembly being arranged on said support with said major surface facing the inner wall and spaced apart therefrom by a gas passage and a spacer located between and spacing the support from the housing.

2. A microelectronic package according to claim 1 wherein the spacer is attached to the support and engages the inner wall.

3. A microelectronic package according to claim 1 wherein the support is a cylinder or a polygonal prism and defines a interior chamber suitable for receiving a component.

4. A microelectronic package according to claim 1 wherein the tubular housing comprises a longitudinal axis, and wherein the support comprises a plurality of co-axial ribs to which the substrate is affixed.

5. A microelectronic package according to claim 1 wherein the support comprises a support surface spaced apart from the inner wall, and wherein the substrate is attached to the support surface.

6. A microelectronic package comprising:
   a tubular housing comprising a cylindrical inner wall defining a compartment and symmetrical about an axis;
   a support received in said compartment and comprising a plurality of axial ribs; and
   a microelectronic assembly comprising at least one substrate having a major surface, said microelectronic assembly being affixed to said ribs such that the major surface is parallel to the axis and faces the cylindrical inner wall spaced apart therefrom.

7. A microelectronic package according to claim 6 wherein the microelectronic assembly comprises electronic components attached to the major surface.

8. A microelectronic package according to claim 6 wherein the microelectronic assembly comprises a plurality of substrates and electronic components attached to the substrates, each substrate having axial edges affixed to the ribs, said microelectronic assembly further comprising flexible interconnects extending about said ribs and connecting electronic components on adjacent substrates.

9. A microelectronic package according to claim 6 wherein the support comprises end frames attached to the axial ribs and comprising spacers that extend radially outward from said end frames and engage the cylindrical inner wall to provide spacing between the microelectronic assembly and the cylinder inner wall.

10. A microelectronic package according to claim 6 wherein the support and the microelectronic assembly surround a central chamber suitable for receiving other components.

11. A microelectronic package according to claim 6 wherein the microelectronic assembly is spaced apart from the cylindrical wall to define a peripheral gas passage therebetween for conveying coolant gas.

12. A microelectronic package comprising:
 a tubular housing comprising a cylindrical inner wall defining a compartment and symmetrical about an axis;
 a support received in the compartment and comprising a support surface spaced apart from the cylindrical inner wall; a plurality of spacers located between the housing and the support and spacing the support apart from the cylindrical wall, and
 a microelectronic assembly formed of a flexible substrate having a major surface and a plurality of microelectronic components attached to the surface, said microelectronic assembly being attached to the support surface such that the major surface faces the cylindrical inner wall and is spaced apart therefrom.

13. A microelectronic package according to claim 12 wherein the plurality of spacers are part of the support, the spacers radially extending above the support surface and engaging the cylindrical inner wall to provide spacing between the microelectronic assembly and the cylinder inner wall.

14. A microelectronic package according to claim 12 wherein the support defines a central chamber.

15. A microelectronic package according to claim 12 wherein the microelectronic assembly is spaced from the cylindrical inner wall to define a peripheral gas passage for conveying coolant gas.

* * * * *

UNITED STATES PATENT AND TRADEMARK OFFICE
CERTIFICATE OF CORRECTION

PATENT NO. : 6,778,389 B1
DATED : August 17, 2004
INVENTOR(S) : Andrew Z. Glovatsky et al.

It is certified that error appears in the above-identified patent and that said Letters Patent is hereby corrected as shown below:

Title page,
Item [57], ABSTRACT,
Line 11, delete "Movement," and substitute -- Moreover, -- in its place.

Signed and Sealed this

First Day of February, 2005

JON W. DUDAS
*Director of the United States Patent and Trademark Office*